(12) United States Patent
Currier et al.

(10) Patent No.: US 9,781,850 B1
(45) Date of Patent: Oct. 3, 2017

(54) PRESS-FIT CONTACT WINDOW COVER RETENTION

(71) Applicant: Continental Automotive Systems, Inc., Auburn Hills, MI (US)

(72) Inventors: David Wayne Currier, McHenry, IL (US); Donald J Zito, Fox River Grove, IL (US); Keith A Meny, Lake Zurich, IL (US); James D Baer, Gurnee, IL (US)

(73) Assignee: Continental Automotive Systems, Inc., Auburn Hills, MI (US)

( * ) Notice: Subject to any disclaimer, the term of this patent is extended or adjusted under 35 U.S.C. 154(b) by 0 days.

(21) Appl. No.: 15/163,774

(22) Filed: May 25, 2016

(51) Int. Cl.
    *H05K 5/00* (2006.01)
    *H05K 5/02* (2006.01)
    *H05K 5/03* (2006.01)

(52) U.S. Cl.
    CPC ......... *H05K 5/0069* (2013.01); *H05K 5/0008* (2013.01); *H05K 5/0247* (2013.01); *H05K 5/03* (2013.01)

(58) Field of Classification Search
    CPC .. H05K 5/0069; H05K 5/0008; H05K 5/0247; H05K 5/03
    USPC .......................... 361/728–730, 752, 796, 800
    See application file for complete search history.

(56) References Cited

U.S. PATENT DOCUMENTS

| | | | | |
|---|---|---|---|---|
| 6,881,077 | B2 * | 4/2005 | Throum | H05K 5/0052 174/16.3 |
| 7,697,300 | B2 * | 4/2010 | Brandt | B60R 16/0239 361/704 |
| 8,908,380 | B2 * | 12/2014 | Ohhashi | H05K 5/0052 174/535 |
| 2004/0160731 | A1 * | 8/2004 | Yamaguchi | B60R 16/0238 361/600 |
| 2015/0064962 | A1 * | 3/2015 | Baer | H01R 12/58 439/487 |

* cited by examiner

*Primary Examiner* — Hung S Bui

(57) ABSTRACT

An electronic controller which includes a cover connected to a base plate, a housing, and a printed circuit board disposed in the housing. The base plate includes a press-fit inspection opening or aperture, and a cover is placed on the base plate over the opening, creating a seal path between the cover and the edge of the opening in the base plate. In one embodiment, there is a sealant, such as room temperature vulcanization (RTV) or heat cured sealant, dispensed on the sheet metal base plate around the perimeter of the opening, and the sealant is cured to prevent the formation of a leak path. Prior to the curing process, the cover is held in place by a pressure sensitive adhesive (PSA), as the sealant is cured. The controller is treated to a curing process to cure the sealant between the cover and the base plate.

9 Claims, 6 Drawing Sheets

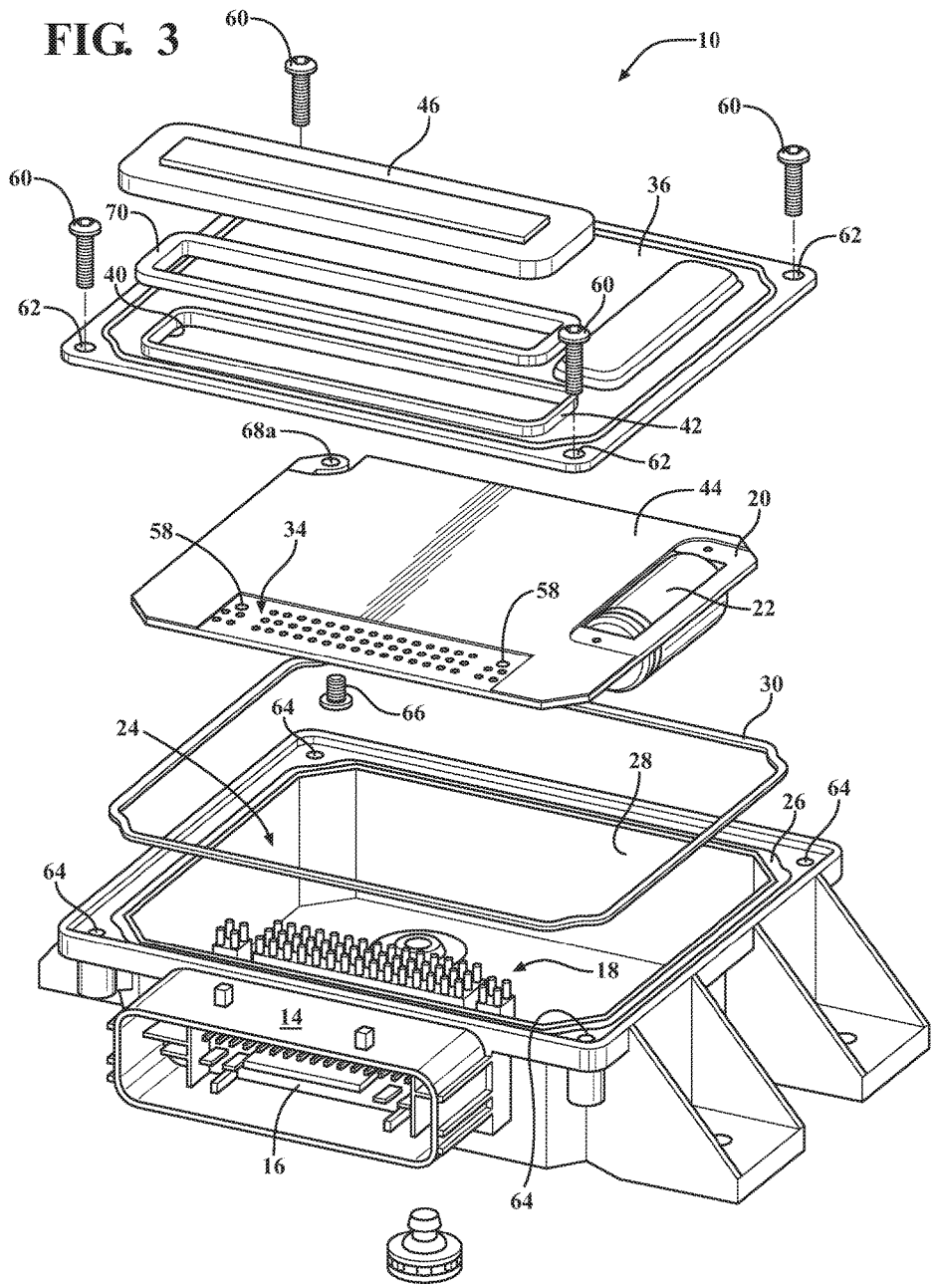

PRESS-FIT CONTACT WINDOW COVER RETENTION

FIELD OF THE INVENTION

The invention relates generally to an electronics controller having a cover which is held in place as a sealant is cured, where the sealant is located between the cover and a base plate.

BACKGROUND OF THE INVENTION

Electronic controllers are generally known. Most electronic controllers include a printed circuit board located in a housing, where a base plate is connected to the housing to cover the printed circuit board. Various pins are connected to the printed circuit board, typically using a press-fit connection. During assembly, in order to ensure that the pins are connected to the printed circuit board correctly, an inspection is performed after the controller is assembled. This requires that the controller is constructed to allow for access to view the printed circuit board, to inspect the pins to make sure they are properly connected to the printed circuit board. Many controllers have some type of window or aperture formed as part of the base plate to allow access for viewing the pins, such that the connection of the pins to the printed circuit board may be inspected. However, once the inspection is completed, the window or aperture needs to be covered and sealed to prevent the creation of a leak path into the housing where the printed circuit board is located. Some solutions to this have involved attaching a cover to the base plate to seal the window, and using fasteners, such as screws, which are inserted into blind holes of the base plate to connect the cover to the base plate. This approach may be suitable for use with base plates which have the necessary thickness, but with certain electronic controllers having base plates which are thinner, a leak path may be created between the screw and the cover when the screw or other type of fastener is used.

Accordingly, there exists a need for an electronic controller which has a base plate with a window or aperture used for viewing the quality of a pin connection to a printed circuit board, while also having a suitable connection between the cover and the base plate to prevent leak paths around the cover into the housing.

SUMMARY OF THE INVENTION

The present invention is an electronic controller which includes a cover connected to a base plate without creating a leak path. The electronic controller also includes a housing, and a printed circuit board disposed in the housing. The base plate includes a press-fit inspection opening or aperture, and a cover is placed on the base plate over the opening, creating a seal path between the cover and the edge of the opening in the base plate. In one embodiment, there is a sealant, such as room temperature vulcanization (RTV) or heat cured sealant, which is dispensed on the sheet metal base plate around the perimeter of the opening formed as part of the base plate, and the sealant is cured to prevent the formation of a leak path.

Prior to the curing process, the cover is held in place by a pressure sensitive adhesive (PSA), which maintains the position of the cover relative to the base plate as the sealant is cured. The PSA is also used to attach the base plate to the printed circuit board, and the base plate is attached to the housing using one or more fasteners. The aperture or opening in the base plate is large enough to expose at least a portion of the PSA, to allow the cover to come in contact with the PSA when the cover is placed on the base plate. The controller is treated to a curing process to cure the sealant between the cover and the base plate.

In one embodiment, the present invention is an electronic controller assembly which includes a housing, a printed circuit board located in the housing, an adhesive disposed on at least a portion of the printed circuit board, and a base plate connected to the housing such that the printed circuit board is in between the housing and the base plate, and an aperture is formed as part of the base plate. The electronic controller assembly also includes a cover, a groove portion integrally formed as part of the cover, at least one support member integrally formed as part of the cover, and at least one contact surface formed as part of the at least one support member. A sealant is disposed in the groove portion, and the cover is positioned relative to the base plate such that the at least one support member extends through the aperture and the at least one contact surface contacts the adhesive. The adhesive maintains the position of the cover relative to the base plate while the sealant is cured, securing the cover to the base plate.

The electronic controller assembly of the present invention also includes an outer rib portion formed as part of the base plate such that the outer rib portion circumscribes the aperture. The outer rib portion is disposed in the groove portion when the cover is attached to the base plate such that the sealant is in contact with and at least partially surrounds the outer rib portion.

There is also an inner surface formed as part of the cover, and an internal rib portion surrounding the inner surface. The cover also includes an external rib portion, and the groove portion disposed between the internal rib portion and the external rib portion. In one embodiment, the support member is longer than the internal rib portion relative to the inner surface, and the external rib portion is shorter than the internal rib portion to facilitate the connection between the cover and the base plate.

The electronic controller assembly also includes at least one alignment pin integrally formed with the cover; and at least one alignment aperture formed as part of the printed circuit board. The alignment pin extends through the alignment aperture to position the cover relative to the base plate.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein:

FIG. 3 is a second exploded view of an electronic controller assembly, according to embodiments of the present invention;

DETAILED DESCRIPTION OF THE PREFERRED EMBODIMENTS

The following description of the preferred embodiment(s) is merely exemplary in nature and is in no way intended to limit the invention, its application, or uses.

Figure 1:
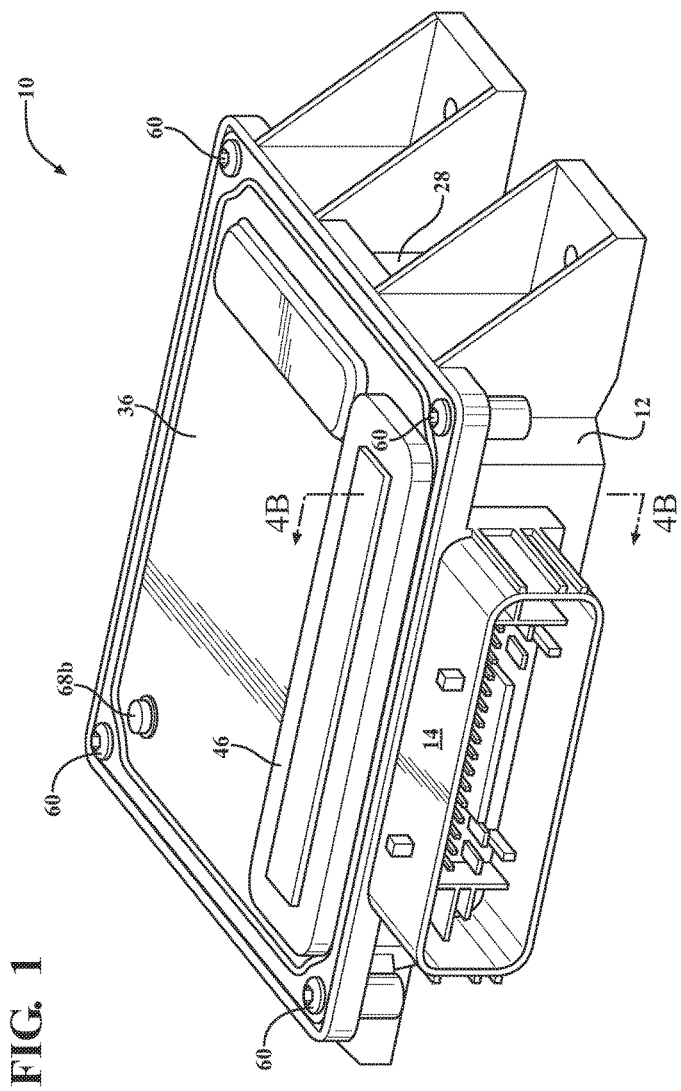
FIG. 1 is a perspective view of an electronic controller assembly, according to embodiments of the present invention.
Figure 2:
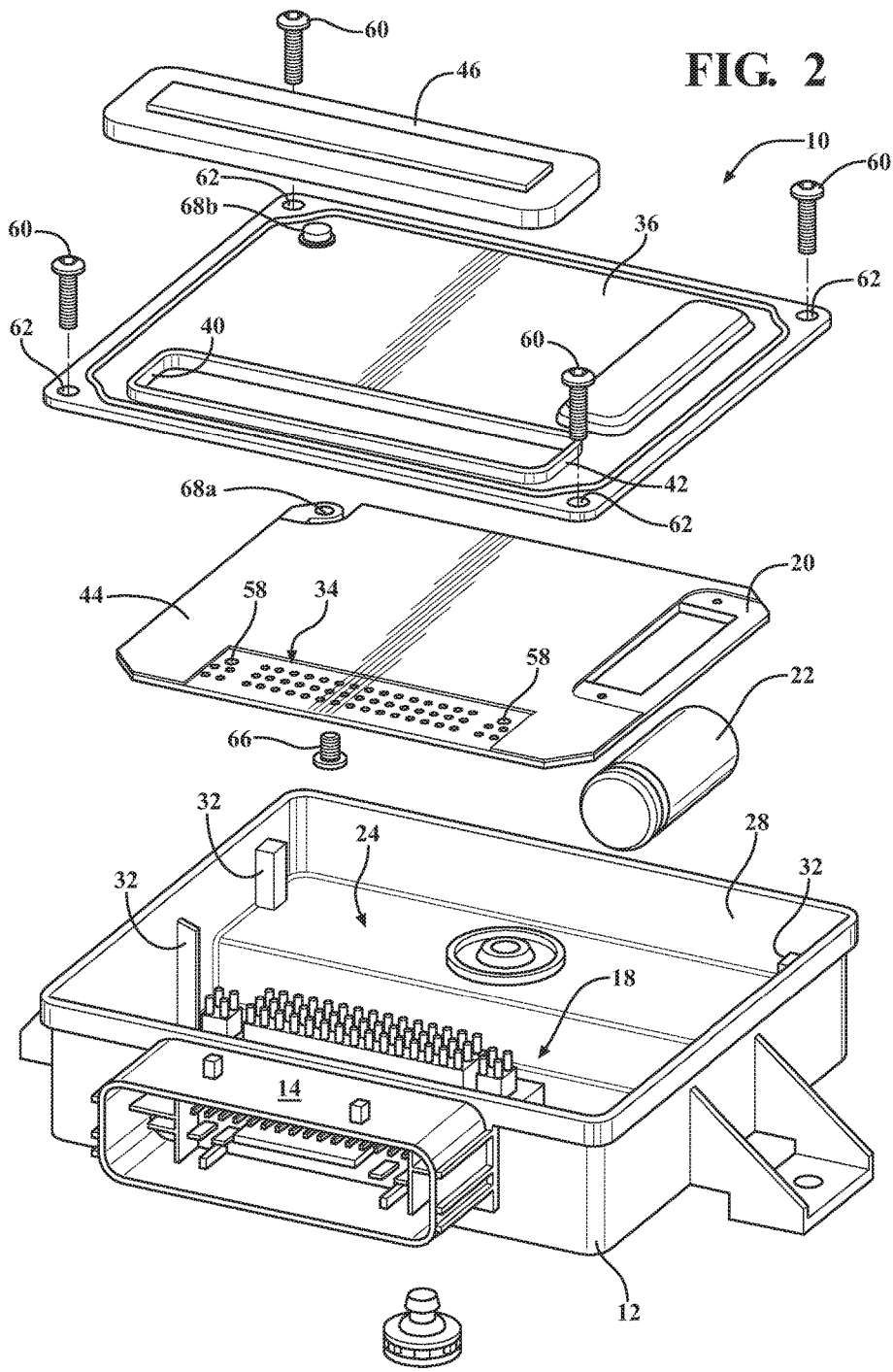
FIG. 2 is a first exploded view of an electronic controller assembly, according to embodiments of the present invention.
Figure 4A:
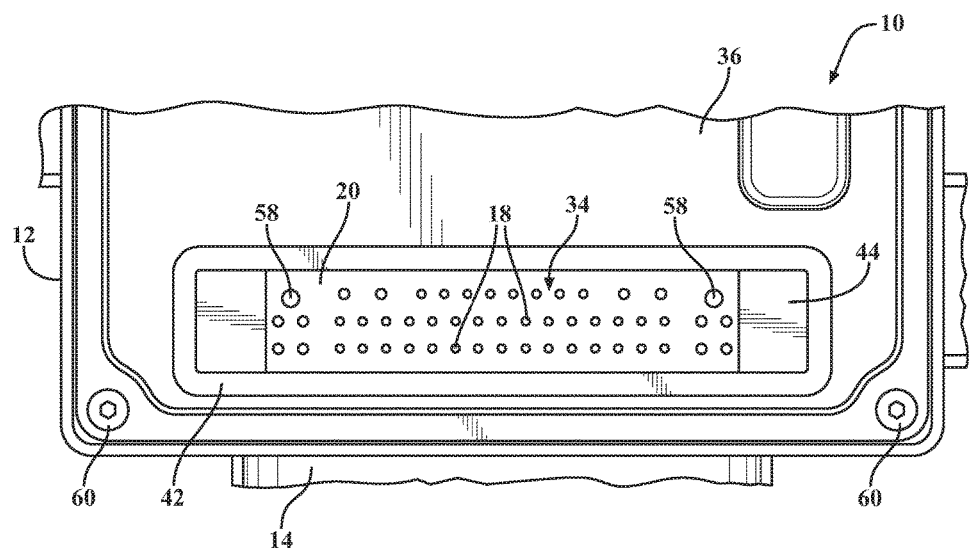
FIG. 4A is a top view of part of an electronic controller assembly, according to embodiments of the present invention
Figure 4B:
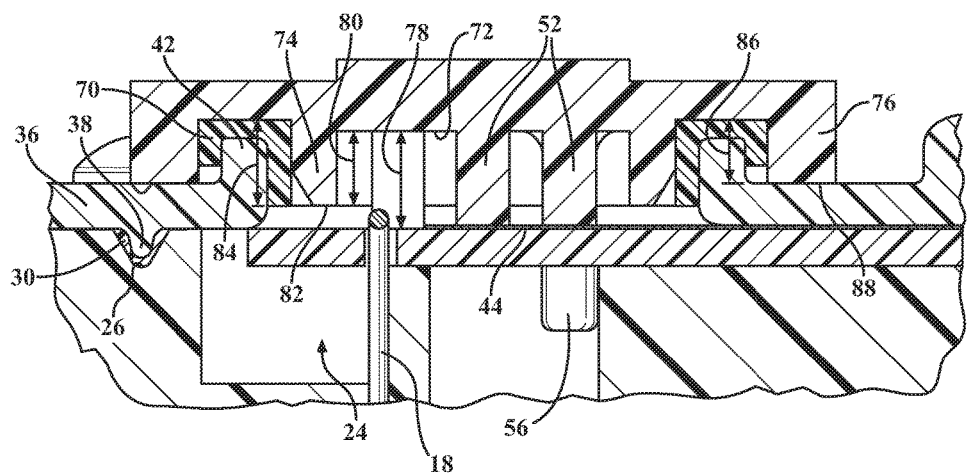
FIG. 4B is a sectional side view taken along lines 4B-4B of FIG. 1.
Figure 5:
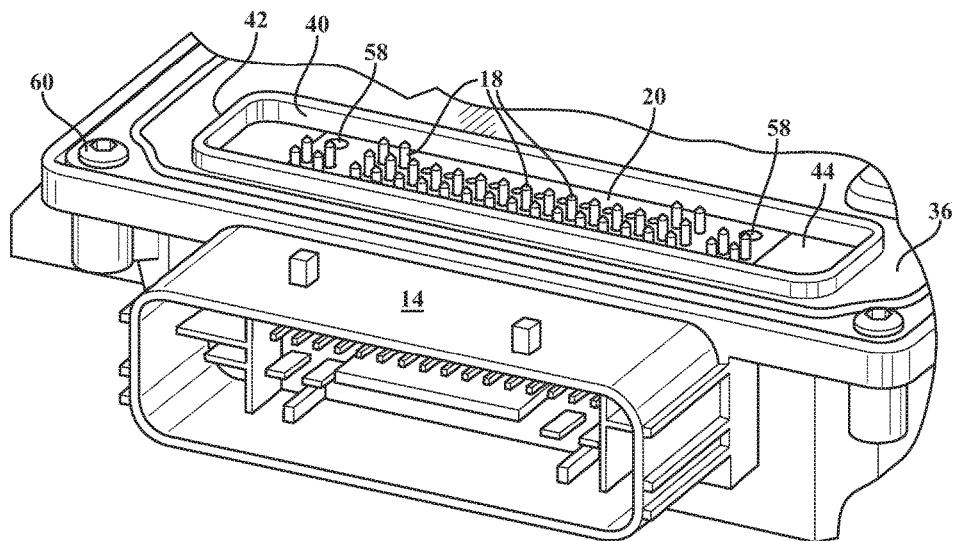
FIG. 5 is an enlarged perspective view of a portion of an electronic controller assembly, according to embodiments of the present invention.
Figure 6:
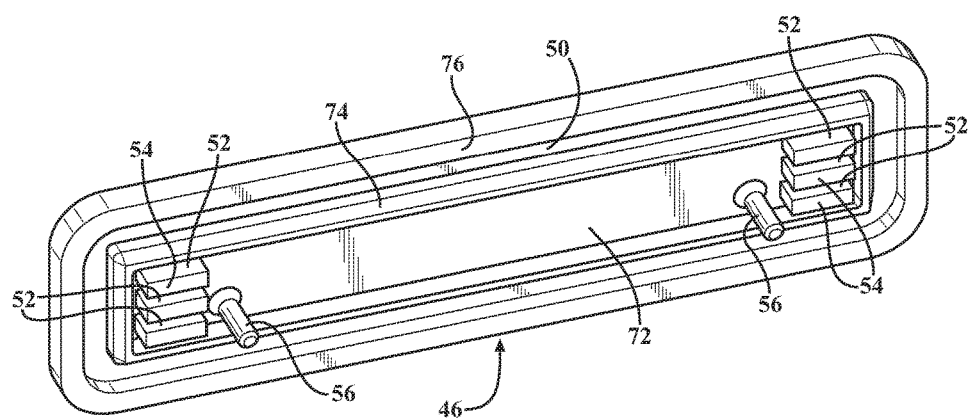
FIG. 6 is a perspective view of a cover used as part of an electronic controller assembly, according to embodiments of the present invention.
Figure 7:
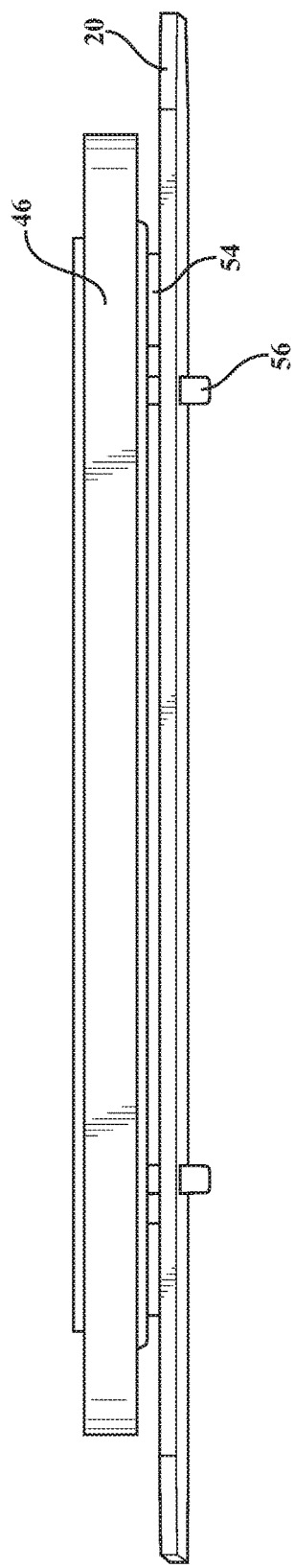
FIG. 7 is a perspective view of a cover attached to a printed circuit board used as part of an electronic controller assembly, according to embodiments of the present invention.

An electronic controller according to the present invention is shown in the Figures generally at 10. The controller 10 includes a housing 12, and formed as part of the housing 12 is a shroud 14, and a wall 16 formed as part of the housing 12 in proximity to the shroud 14. There is a plurality of pins, shown generally at 18, where a portion of each pin 18 extends through the wall 16, and is in an area surrounded by the shroud 14. Each pin 18 is angled, and also extends out of the housing 12 as shown in FIG. 2 such that during assembly, a portion of each pin 18 extends through a printed circuit board (PCB) 20. The PCB 20 is attached to the housing 12 during assembly. Also located in a cavity, shown generally at 24, of the housing 12 are other various components, such as a capacitor 22, which is connected to the PCB 20.

The housing 12 includes a groove 26 which is formed along an outer wall 28 of the housing 12. During assembly, there is an outer sealant 30 which is placed in the groove 26, the function of which will be described later.

The pins 16 are press-fit through the PCB 20, and the PCB 20 is located in the housing 12 such that the PCB 20 is surrounded by the groove 26 and held in place by a plurality of support pillars 32. The area of the PCB 20 the pins 16 extend through is a pin area, shown generally at 34. During assembly, a base plate 36 is attached to the housing 12 by positioning the base plate 36 relative to the housing 12 such that a rib portion 38 formed as part of the base plate 36 is located in the groove 26 and in contact with the outer sealant 30.

The base plate 36 includes an aperture, which in this embodiment is a press-fit inspection aperture 40, and an outer rib portion 42 formed as part of the base plate 36 and circumscribing the aperture 40. The area of the aperture 40 is larger than the area of the pin area 34. There is a Pressure Sensitive Adhesive (PSA), 44 which is disposed on the PCB 20 as shown in FIG. 3. The PSA 44 covers most of the surface area of the PCB 20, except for the pin area 34, the area of the PCB 20 in proximity to the capacitor 22, and areas of the PCB 20 where a fastener extends through the PCB 20 to attach the PCB 20 to the base plate 36. The difference in the area of the aperture 40 and the pin area 34 is such that a portion of the PSA 44 is exposed in the aperture 40 when the base plate 36 is attached to the housing 12.

The controller 10 also includes a cover 46, which includes a groove portion 50 formed on the inside surface of the cover 46, and the groove portion 50 substantially corresponds to the shape of the outer rib portion 42. Also located on the inside surface of the cover 46 is a plurality of support members 52, each of the support members 52 having a contact surface 54. There are also alignment pins 56 which are integrally formed as part of the cover 46, where the alignment pins 56 extend through alignment apertures 58 formed as part of the PCB 20 to ensure proper alignment between the cover 46 and the PCB 20. In this embodiment, there are a total of six support members 52 and two alignment pins 56. However, it is within the scope of the invention that more or less support members 52 and alignment pins 56 may be used, depending upon the application, and the desired construction of the controller 10.

The support members 52 and the alignment pins 56 extend away from an inner surface 72 formed as part of the cover 46. Adjacent the inner surface 72 is an internal rib portion 74, and there is also an external rib portion 76, where the groove portion 50 is disposed between the internal rib portion 74 an the external rib portion 76. The support members 52 are formed such that the contact surface 54 is at a greater distance 78 from the inner surface 72 compared to the distance 80 of the edge 82 of the internal rib portion 74. Furthermore, the depth 84 of the groove portion 50 relative to the edge 82 of the internal rib portion 74 is greater than the distance 80 from the edge 82 of the internal rib portion 74 to the inner surface 72. Also, the distance 86 from the edge 88 of the external rib portion 76 from the groove portion 50 is less than the depth 84 from the edge 82 of the internal rib portion 74.

There is also a plurality of fasteners, such as screws 60, which extend through corresponding apertures 62 formed as part of the base plate 36, and into corresponding threaded apertures 64 formed as part of the housing 12 to secure the base plate 36 to the housing 12. There is also an additional fastener, which in this embodiment is a screw 66, which extends through an aperture 68a formed as part of the PCB 20 and into a corresponding recess 68b formed as part of the base plate 36, to secure the PCB 20 to the base plate 36.

To secure the cover 46 to the base plate 36, there is a sealant 70 which is placed in the groove portion 50 of the cover 46. The cover 46 is then placed onto the base plate 36 such that the outer rib portion 42 is disposed in the groove portion 50 and in contact with the sealant 70, the contact surfaces 54 of each support member 52 contact the PSA 44, and the alignment pins 56 extend through the alignment apertures 58 of the PCB 20. The PSA 44 functions to maintain the position of the cover 46 relative to the base plate 36 as soon as the contact surfaces 54 contact the PSA 44. As the cover 46 is maintained in position relative to the base plate 36, the assembled controller 10 then goes through a curing process, where the outer sealant 30 and the sealant 70 are both cured, securely connecting the base plate 36 to the housing 12, and the cover 46 to the base plate 36. In one embodiment, the outer sealant 30 and the sealant 70 are a Room Temperature Vulcanization (RTV) adhesive, but it is within the scope of the invention that either sealant 30,70 may be another type of adhesive, such as thermally conductive adhesive (TCA), PSA, or another type of adhesive.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. An apparatus, comprising:
an electronic controller, including:

a housing;

a printed circuit board located in the housing;

an adhesive disposed on at least a portion of the printed circuit board;

a base plate connected to the housing such that the printed circuit board is in between the housing and the base plate;

an aperture formed as part of the base plate;

a cover; and a sealant disposed on a portion of the cover such that the sealant is in contact with both the cover and the base plate;

wherein the cover is positioned relative to the base plate such that a portion of the cover extends through the aperture and contacts the adhesive, and the connection between the cover and the adhesive maintains the position of the cover relative to the base plate until the sealant is cured, and the sealant connects the cover to the base plate.

2. The apparatus of claim 1, further comprising:

a groove portion integrally formed as part of the cover;

wherein the sealant is disposed in the groove portion when the cover is connected to the base plate.

3. The apparatus of claim 2, further comprising:

an outer rib portion formed as part of the base plate such that the outer rib portion circumscribes the aperture;

wherein the outer rib portion is disposed in the groove portion when the cover is attached to the base plate such that the sealant is in contact with the outer rib portion, and the sealant is cured to maintain the position of the outer rib portion in the groove portion.

4. The apparatus of claim 1, further comprising:

at least one support member integrally formed as part of the cover; and at least one contact surface formed as part of the at least one support member;

wherein the cover is positioned relative to the base plate such that the at least one support member extends through the aperture and the at least one contact surface contacts the adhesive, and the adhesive maintains the position of the cover relative to the base plate while the sealant is cured.

5. The apparatus of claim 1, further comprising:

at least one alignment pin integrally formed with the cover; and at least one alignment aperture formed as part of the printed circuit board;

wherein the at least one alignment pin extends through the at least one alignment aperture to position the cover relative to the base plate when the cover is attached to the base plate.

6. An electronic controller assembly, comprising:

a housing;

a printed circuit board located in the housing;

an adhesive disposed on at least a portion of the printed circuit board;

a base plate connected to the housing such that the printed circuit board is in between the housing and the base plate;

an aperture formed as part of the base plate;

a cover;

a groove portion integrally formed as part of the cover;

at least one support member integrally formed as part of the cover;

at least one contact surface formed as part of the at least one support member; and a sealant disposed in the groove portion;

wherein the cover is positioned relative to the base plate such that the at least one support member extends through the aperture and the at least one contact surface contacts the adhesive, and the adhesive maintains the position of the cover relative to the base plate while the sealant is cured, securing the cover to the base plate.

7. The electronic controller assembly of claim 6, further comprising:

an outer rib portion formed as part of the base plate such that the outer rib portion circumscribes the aperture;

wherein the outer rib portion is disposed in the groove portion when the cover is attached to the base plate such that the sealant is in contact with and at least partially surrounds the outer rib portion.

8. The electronic controller assembly of claim 6, further comprising:

an inner surface formed as part of the cover;

an internal rib portion surrounding the inner surface; and an external rib portion, the groove portion disposed between the internal rib portion and the external rib portion;

wherein the at least one support member is longer than the internal rib portion relative to the inner surface, and the external rib portion is shorter than the internal rib portion.

9. The electronic controller assembly of claim 6, further comprising:

at least one alignment pin integrally formed with the cover; and at least one alignment aperture formed as part of the printed circuit board;

wherein the at least one alignment pin extends through the at least one alignment aperture to position the cover relative to the base plate.

* * * * *